United States Patent [19]

Stitt

[11] 4,303,934
[45] Dec. 1, 1981

[54] MOLDED LEAD FRAME DUAL IN LINE PACKAGE INCLUDING A HYBRID CIRCUIT

[75] Inventor: Robert M. Stitt, Tucson, Ariz.

[73] Assignee: Burr-Brown Research Corp., Tucson, Ariz.

[21] Appl. No.: 71,400

[22] Filed: Aug. 30, 1979

[51] Int. Cl.³ ............... H01L 23/02; H01L 23/12; H01L 23/16
[52] U.S. Cl. ............................... 357/14; 357/72; 357/75; 357/80; 357/73; 174/52 FP
[58] Field of Search ............. 357/74, 72, 75, 80, 357/73; 174/52 FP

[56] References Cited

U.S. PATENT DOCUMENTS

| 3,535,486 | 10/1970 | Wood | 357/80 |
|---|---|---|---|
| 3,585,272 | 6/1971 | Shatz | 357/74 |
| 3,659,035 | 4/1972 | Pianzo | 357/74 |
| 3,768,157 | 10/1973 | Buie | 357/74 |
| 4,079,511 | 3/1978 | Grabbe | 357/74 |
| 4,105,861 | 8/1978 | Hascoe | 357/74 |
| 4,163,072 | 7/1979 | Soos | 357/80 |
| 4,195,193 | 3/1980 | Grabbe | 357/74 |
| 4,208,698 | 6/1980 | Narasimhan | 357/80 |

*Primary Examiner*—Andrew J. James
*Attorney, Agent, or Firm*—Harry M. Weiss

[57] ABSTRACT

A molded dual in line package is disclosed which has at least one cavity in a first major molded surface thereof into which an integrated circuit chip can be mounted and wire bonded. After the circuit is tested and adjusted, the cavity is sealed with a metal plate. Other embodiments are disclosed which include a second cavity in a second major molded surface of the package which may house or contain a second integrated circuit, an epoxy sealer, or a substrate.

1 Claim, 7 Drawing Figures

MOLDED LEAD FRAME DUAL IN LINE PACKAGE INCLUDING A HYBRID CIRCUIT

BACKGROUND OF THE INVENTION

1. Field of the Invention

This invention relates generally to molded dual in line packages (DIPs) and fabrication methods therefor, and more particularly to DIPs and fabrication methods therefor having semiconductor or integrated circuit chips mounted thereon and wire bonded thereto.

2. Description of the Prior Art

In the past, semiconductor devices were initially made and packaged by electrically connecting each chip containing a semiconductor device to a substrate having a printed circuit or conductive pattern thereon. These early forms of packages generally had passive (i.e. resistors, capacitors, etc.) devices located on the substrate and became known as hybrid circuits because of the combination of semiconductor and nonsemiconductor types of devices on a single substrate. Generally, the substrate that was used for the package was an insulator made of, for example, ceramic or glass. The semiconductor chip was either mounted face down ("Flip-Chip") or face up. In the face up type of mounting, electrically conductive leads were connected, such as by wire bonding, to specific conductors of the pattern of conductors located on the substrate. In the Flip-Chip type of mounting, the semiconductor chip was electrically and mechanically connected such as by solder bumps to soldered regions electrically connected to conductors located on the substrate.

As the semiconductor technology developed, lead frame DIPs were created and used as a means of providing packages for semiconductor integrated circuit (IC) chips. These DIPs were ideal to use as packages for IC chips because they could be manufactured in high volume at relatively lower cost than previous types of packages. To complete the package, plastic was formed in a plastic molding operation about portions of the lead frame including the IC chip to provide an encapsulation therefor.

Although molded lead frame DIPs are non-hermetic, they offer certain significant advantages. First, they can be manufactured at a very low cost and are machine insertable. Second, their leads are accessible from the top which facilitates testing and monitoring of certain functions. As a result, molded lead frame DIPs have become widely accepted in the marketplace.

Unfortunately, prior art molded lead frame packages suffer certain serious disadvantages. Integrated circuit electronic parameters shift during molding due to pressure and other interactions with the molding epoxy. High yield losses of sensitive or complex chips are probably due to the flow of molding epoxy and contact with the chips and wire bonds. Integrated circuit performance shifts and wire bond degradation are possible due to the relatively high molding temperatures (300° C. to 400° C.) to which the integrated circuits are exposed. Furthermore, many chips in such packages tend to degrade in performance or fail entirely over a period of time.

Since the leads are shorted together in the lead frame until molding is completed, the completed package cannot be tested until molding is complete. However, when the molding operation is completed and the lead frame cut to provide the completed DIP for testing, it is virtually impossible to do anything further to the chip located within the molded plastic encapsulator. For example, a very expensive chip which has only a single broken lead can not be repaired without the laborious job of delicately cutting apart the encapsulation. Cutting apart the encapsulation to get to the chip for repair is not very practical to say the least, especially in view of the danger of creating more damage to the chip.

Furthermore, integrated circuits mounted upon open lead frames must be handled by molding personnel who may create damage to the chip, bonds or package during such handling. More time and care are required for loading the molds, and higher operator skill is required. Therefore, yield losses due to handling must be expected. Furthermore, if completed IC packaged units are operated over wide temperature ranges, the materials mismatch and differential thermal expansion between the epoxy in contact with the semiconductor integrated circuit chip and the wire bonds can cause additional reliability problems and failure. As a result of the above problems, a need existed to provide a DIP package to overcome these problems.

SUMMARY OF THE INVENTION

It is an object of the present invention to provide an improved DIP which avoids the above described disadvantages.

It is still another object of this invention to provide a method for fabricating an improved DIP which avoids the above described disadvantages.

It is a further object of the invention to provide an improved DIP and fabrication method therefor wherein the semiconductor integrated circuit chip can be wire bonded and the circuit tested after a plastic molding operation is completed.

It is yet another object of the invention to provide an improved DIP and fabrication method therefor which results in higher yield, higher reliability and which can be manufactured at relatively low cost.

It is yet another object of the present invention to provide an improved DIP and fabrication method therefor which is capable of housing two or more separate integrated circuit chips.

Finally, it is an object of the present invention to provide an improved DIP and fabrication method therefor which can accommodate a hybrid circuit package having thick film circuitry.

According to a broad aspect of the invention there is provided a dual in line package for housing at least one circuit having at least one semiconductor chip comprising an insulator molded housing having first and second major surfaces and at least one cavity in said first major surface; a first plurality of external electrically conductive leads; a second plurality of internal electrically conductive leads coupled to said first plurality of leads and accessible from within said at least one cavity; support means within said housing and forming a lower surface of said at least one cavity upon which said at least one circuit is mounted, said at least one circuit being electrically coupled to said second plurality of leads; and first cover means for sealing said at least one circuit in said at least one cavity.

According to another embodiment of this invention, a method for fabricating an improved molded dual in line package comprises the steps of forming a molded dual in line package having at least one cavity located within one surface portion of the package, positioning a first circuit within said cavity and electrically connecting said first circuit to said package, and sealing said cavity to protect said circuit located within said cavity.

The above and other objects, features and advantages of the present invention will be more clearly understood from the following detailed description taken in conjunction with the accompanying drawings, in which:

DESCRIPTION OF THE PREFERRED EMBODIMENT

Figure 1A:
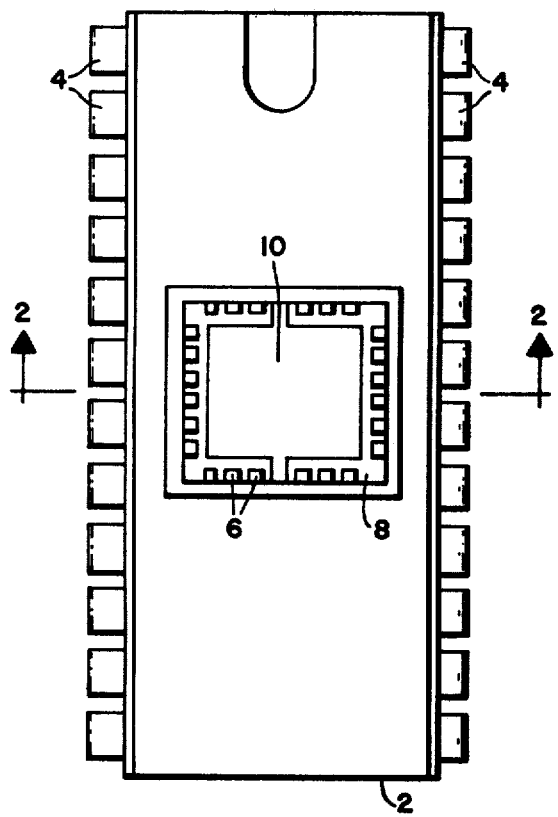
FIG. 1A and 1B are top and side views of an improved molded dual in line package (without semiconductor or integrated circuit chip) in accordance with the present invention.
Figure 1B:
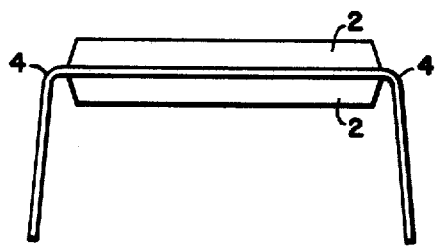

FIGS. 1A and 1B are top and side views respectively of a molded dual in line package in accordance with the present invention. The molded DIP package of FIGS. 1A and 1B comprises a housing 2 having external electrically conductive leads 4, internal electrically conductive leads such as is shown at 6 (in FIG. 1A), an aperture or cavity 8 located within the molded plastic and a metal support plate or lead frame flag 10. Package 2 is premolded to contain the aperture or cavity 8 such as by locating a suitable plug in the mold that is used to form the molded DIP. Preferably, the cavity 8 is made larger than the support plate 10 to expose the leads 6. If desired the leads can then be trimmed and formed to provide a header-like cavity package.

Figure 2:
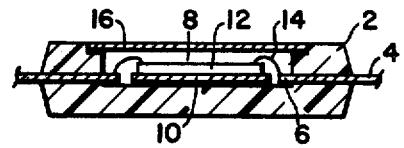
FIG. 2 is a cross-sectional side view of the DIP package shown in FIG. 1A taken along the line 2—2 but with a semiconductor or integrated circuit chip.

Referring now to FIG. 2, which is a cross-section of the package shown in FIG. 1A taken along line 2—2, it can be seen that a semiconductor or integrated circuit chip 12 can be placed on and die bonded to the plate 10 and wire bonded to leads 6 such as is shown at 14. After the integrated circuit is die and wire bonded, the circuit may be tested and adjusted. If any failures are created by broken wires, for example, this can be corrected because of access to the chip 12 because of the cavity 8. To seal the package, a cover 16 can be attached with epoxy. In this manner, the shifting problems associated with molded circuitry where the plastic is in contact with the chip would be eliminated. The removable cover 16 may be manufactured from stainless steel having an epoxy coating and could be stamped from B-stage epoxy coated stainless steel sheets. The cost of such covers would be very low.

Figure 3:
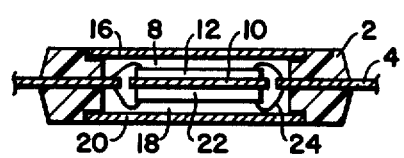
FIG. 3 is a view similar to FIG. 2 illustrating a second embodiment of the inventive package having a cavity on both sides.
Figure 4:
FIG. 4 is a view similar to FIG. 3 illustrating a DIP according to the present invention having a cavity on both sides wherein the bottom cavity is filled with epoxy.

For some applications, it may be necessary to mold the package with a cavity on both sides such as by using two plugs in the mold that is used to form the molded DIP. Such a package is shown in FIG. 3 illustrating additional cavity 18. As was the case with the upper or first cavity 8, the bottom cavity 18 (which is preferably formed simultaneously with the first cavity 8) may also be sealed with an epoxy coated cover 20. Steel covers 16 and 20 on both sides of the cavity provide electromagnetic and electro-static shielding. Alternatively, the bottom cavity may be filled with a liquid epoxy 26 as is shown in FIG. 4. Preferably, the liquid epoxy 26 is a high thermal conductivity epoxy. If desired, the epoxy 26 may contain small BeO (Berylium-Oxide) particles to provide the high thermal conductivity.

Referring again to FIG. 3, the lower cavity may be used to house a second semiconductor or integrated circuit chip 22 which can be wire bonded to internal leads 6 such as is shown at 24. This two chip package has significantly increased density which is especially significant for memory chip packages.

Figure 5:
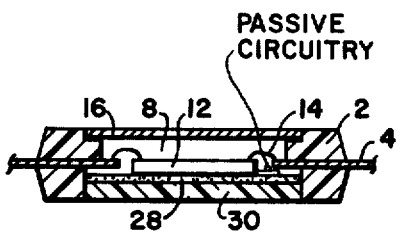
FIG. 5 is a view similar to FIG. 3 illustrating a DIP according to the present invention having a cavity on both sides wherein the bottom cavity is filled with both a substrate and epoxy.

With cavities on both sides of the package, some additional alternate configurations of great merit are possible. In the embodiment shown in FIG. 5, the plate 10 of FIGS. 1A, 2, 3 and 4 can be omitted. An insulator (i.e. glass or preferably ceramic) substrate such as is shown at 28 may then be inserted into the lower cavity and sealed in place by filling the lower cavity with liquid epoxy such as is shown at 30. The top side of the ceramic substrate 28 could accommodate thick film circuitry including passive devices to thereby provide a hybrid circuit.

Figure 6:
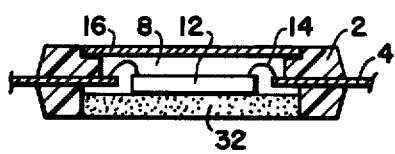
FIG. 6 is a view similar to FIG. 3 illustrating a still further embodiment of the present invention having a cavity on both sides wherein the bottom cavity is substantially filled with a substrate.

Finally, as is shown in FIG. 6, a high thermal conductivity ceramic substrate 32 such as berylium-oxide or aluminum oxide or aluminum coated with $Al_2O_3$ is sealed in place with epoxy. The ceramic substrate preferably extends to the lower package surface thereby providing a direct external thermal path to the outside environment thus forming a power package.

The above description of preferred embodiments is given by way of example only. Changes in form and details may be made therein by one skilled in the art without departing from the scope of the invention as defined by the appended claims.

What is claimed is:

1. A molded dual in line package comprising a housing having at least one circuit comprising at least one semiconductor chip, said housing having first and second major surfaces and at least one cavity in said first major surface;

a first plurality of external electrically conductive leads;

a second plurality of internal electrically conductive leads coupled to said first plurality of leads and accessible from within said at least one cavity;

insulating support means within said housing and forming a lower surface of said at least one cavity upon which said at least one circuit is mounted, said at least one circuit being electrically coupled to said second plurality of leads;

passive circuitry on said support means; and stainless steel metal cover means having epoxy means for sealing said at least one circuit in said at least one cavity, said passive circuitry is electrically coupled to said semiconductor chip.

* * * * *